(12) United States Patent
Kobayashi et al.

(10) Patent No.: US 6,611,172 B1
(45) Date of Patent: Aug. 26, 2003

(54) THERMALLY DISTRIBUTED DARLINGTON AMPLIFIER

(75) Inventors: Kevin Wesley Kobayashi, Torrance, CA (US); Stephen Todd Fariss, Plano, TX (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 0 days.

(21) Appl. No.: 09/888,865

(22) Filed: Jun. 25, 2001

(51) Int. Cl.$^7$ ................................................ H03F 3/04
(52) U.S. Cl. ........................................ 330/289; 330/310
(58) Field of Search ............................ 330/289, 295, 330/310

(56) References Cited

U.S. PATENT DOCUMENTS

| 3,813,588 A | 5/1974 | Ring | 317/235 R |
|---|---|---|---|
| 4,237,426 A | * 12/1980 | Sueyoshi | 330/296 |
| 5,541,439 A | 7/1996 | Mojaradi et al. | 257/488 |
| 5,661,431 A | 8/1997 | Ueno et al. | 327/483 |
| 5,859,568 A | * 1/1999 | Le et al. | 330/289 |
| 5,883,542 A | 3/1999 | Eriksson | 327/483 |
| 6,054,898 A | * 4/2000 | Okuma et al. | 330/266 |

* cited by examiner

Primary Examiner—Henry Choe

(57) ABSTRACT

A Darlington amplifier comprising a first stage and a second stage. The first stage generally comprises one or more first transistors and configured to generate a first and a second signal in response to an input signal. The second stage generally comprises one or more second transistors and may be configured to generate an output signal in response to the first and second signals. The Darlington amplifier may be configured to provide thermal emitter ballasting of the first transistors.

31 Claims, 10 Drawing Sheets

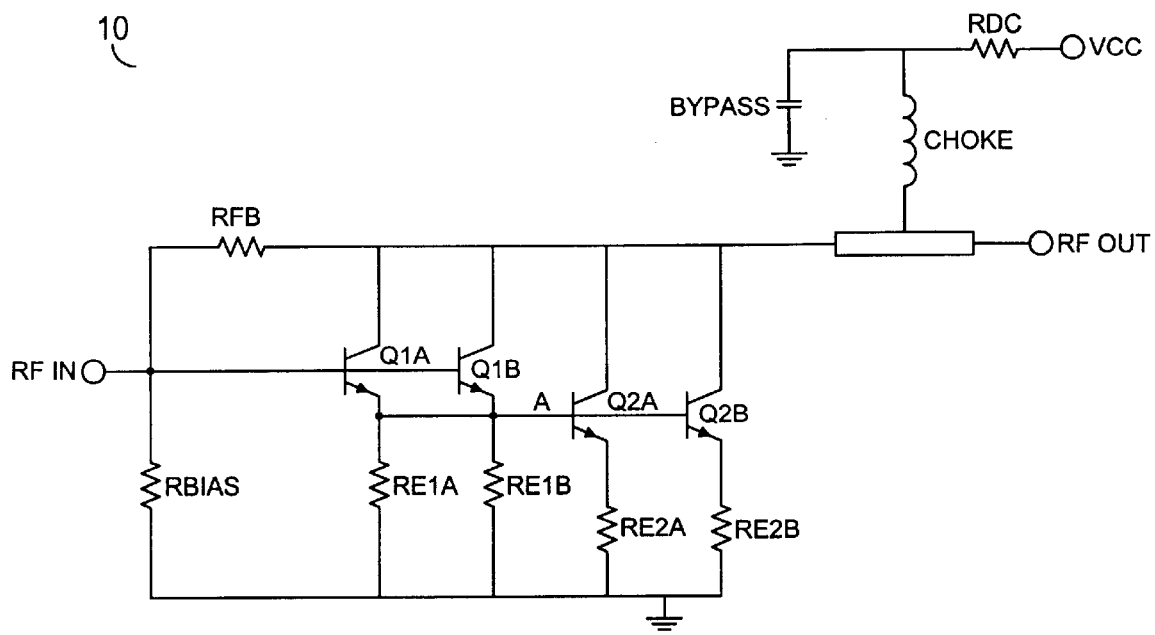
FIG. 1
(CONVENTIONAL)
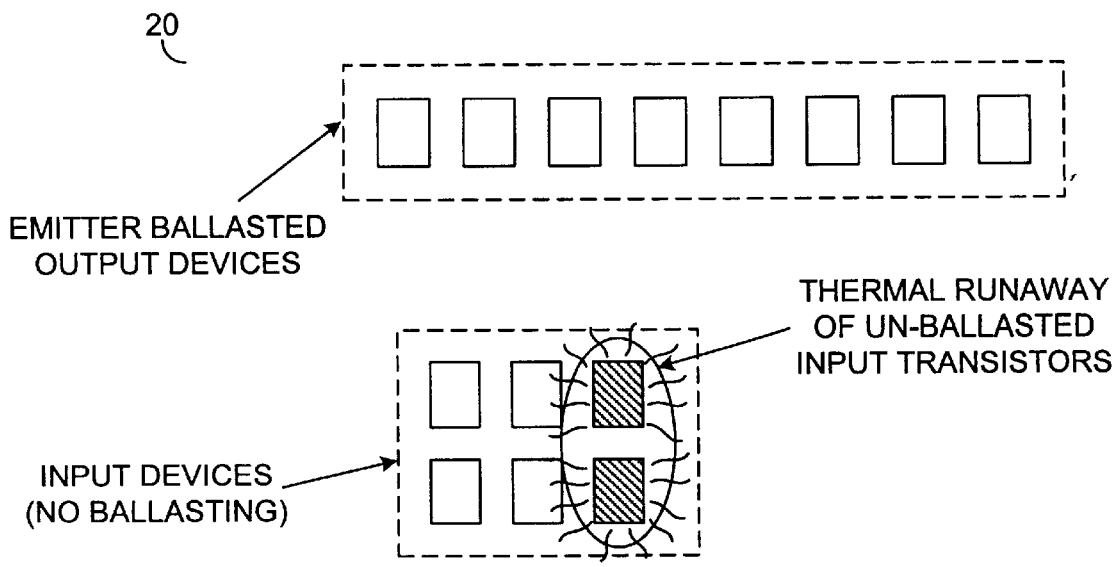
FIG. 2
(CONVENTIONAL)

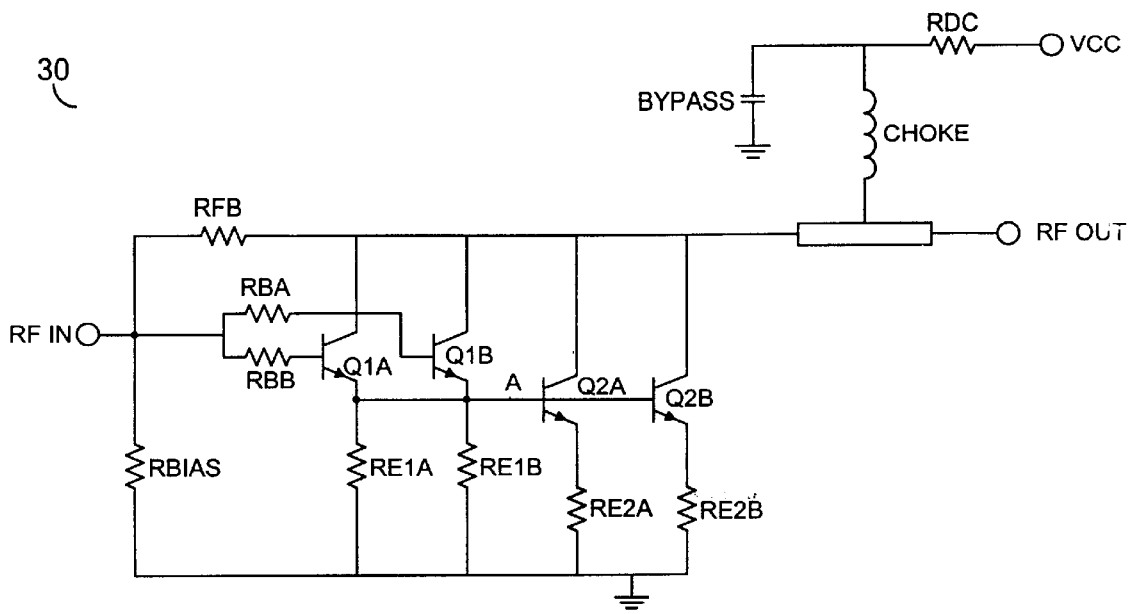
FIG. 3
(CONVENTIONAL)
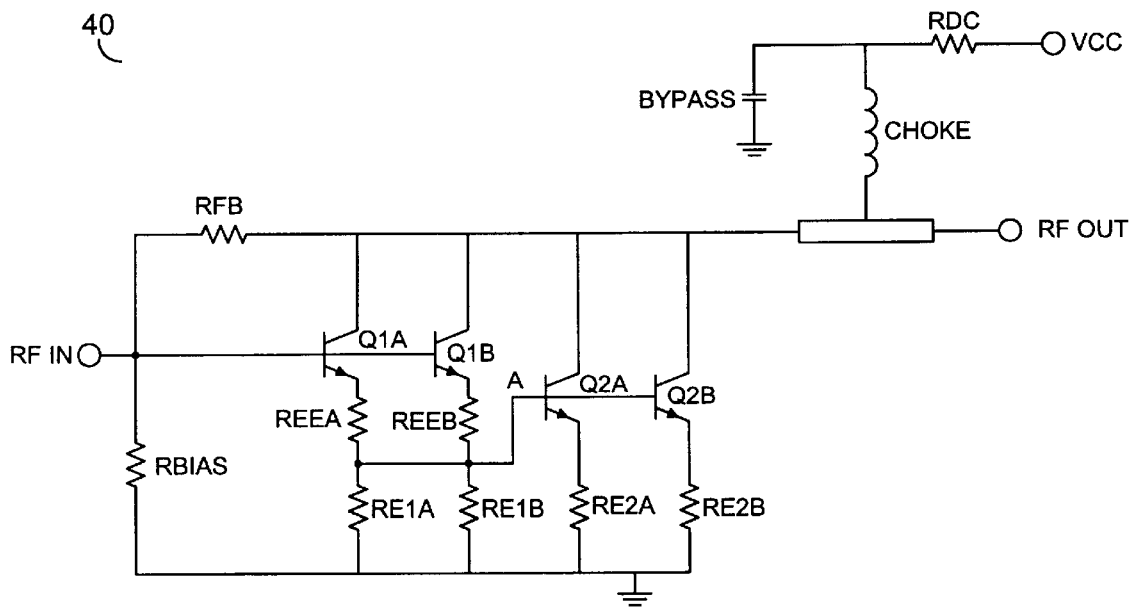
FIG. 4
(CONVENTIONAL)

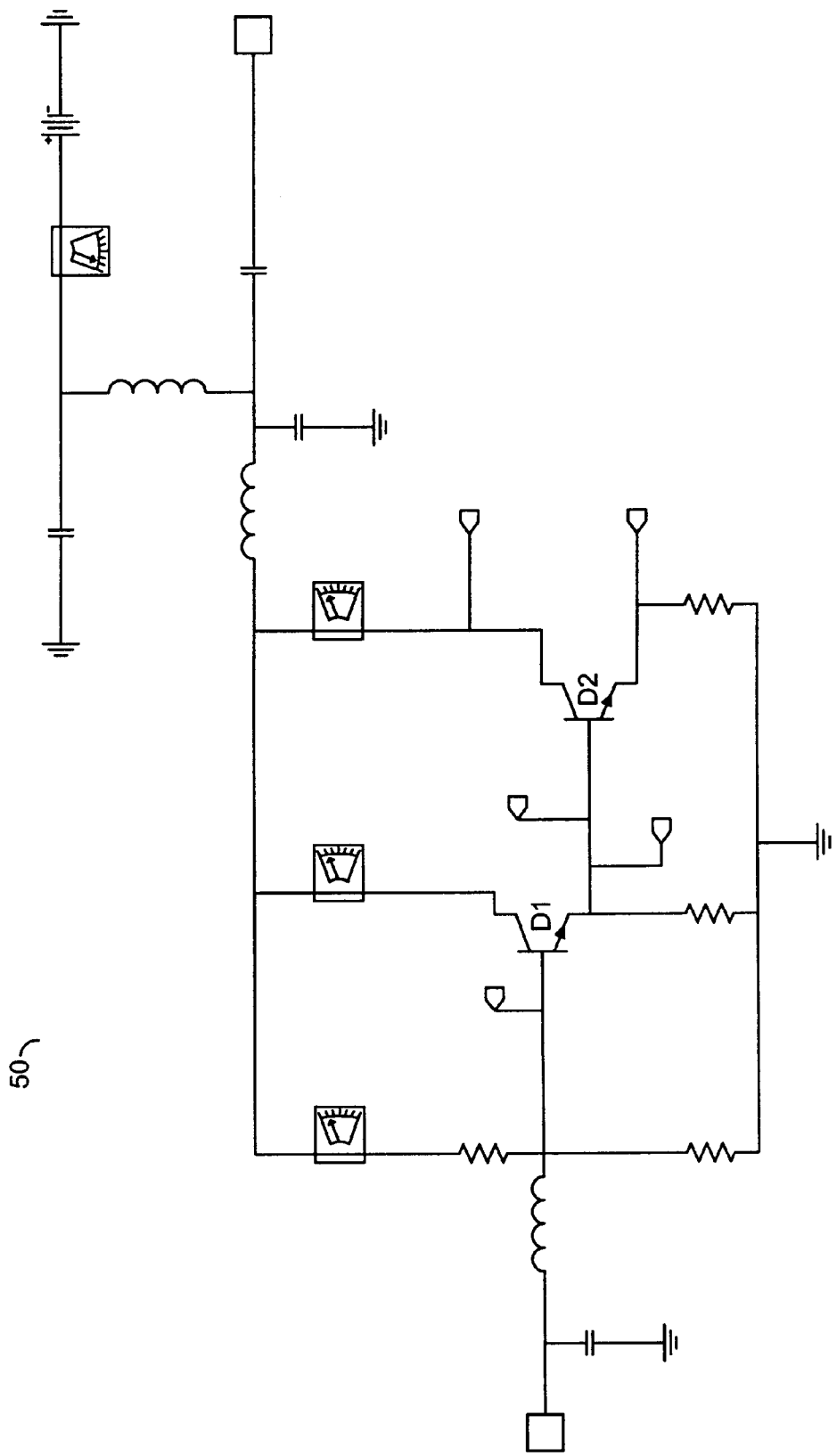
FIG. 6a
(CONVENTIONAL)

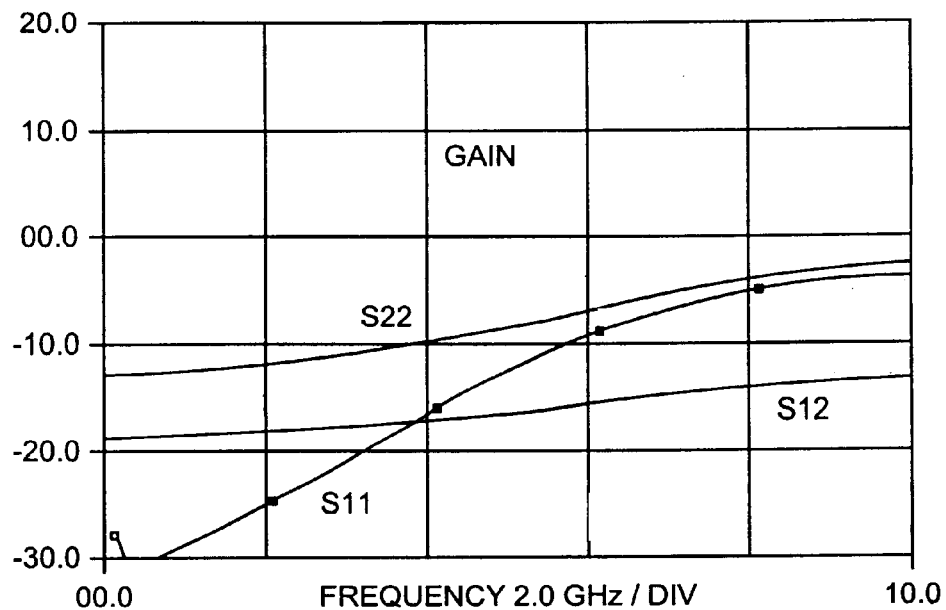
FIG. 7a
(CONVENTIONAL)

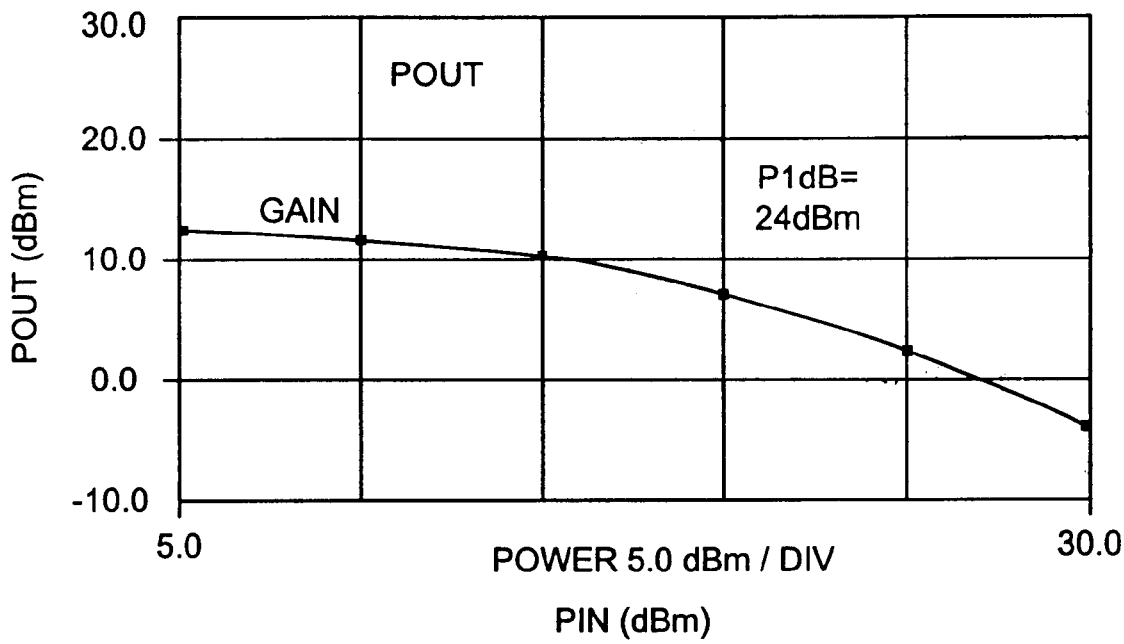
FIG. 8a
(CONVENTIONAL)

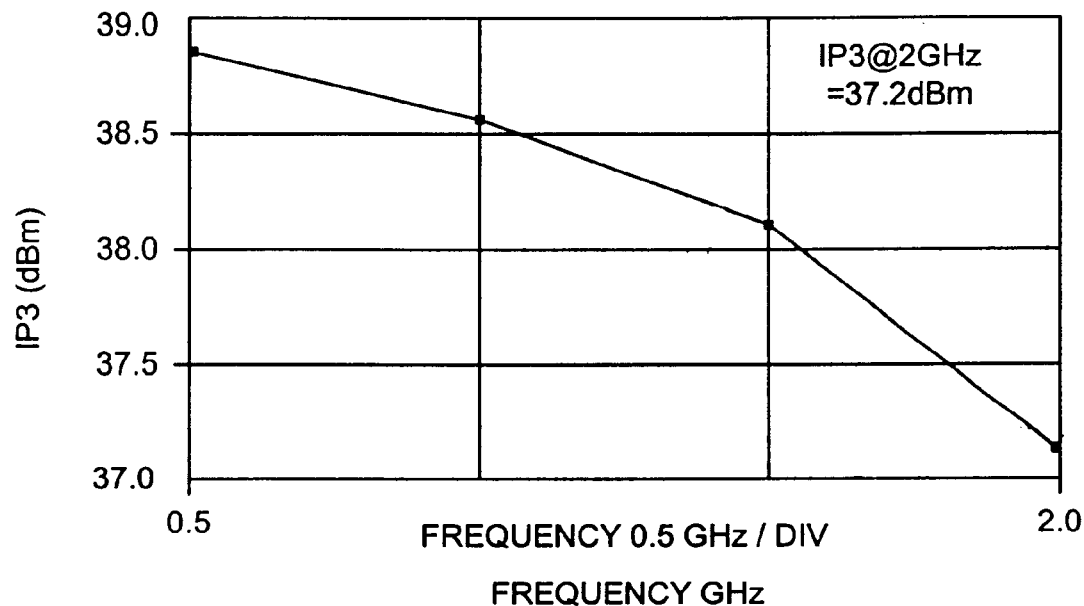
FIG. 9a
(CONVENTIONAL)

THERMALLY DISTRIBUTED DARLINGTON AMPLIFIER

FIELD OF THE INVENTION

The present invention relates to a method and/or architecture for implementing amplifiers generally and, more particularly, to high power Darlington feedback amplifiers.

BACKGROUND OF THE INVENTION

Conventional Darlington feedback amplifier topologies have been widely used for high power-bandwidth characteristics. However, Darlington topologies do not lend to thermal emitter ballasting of input transistors without significant RF performance penalty.

Referring to FIG. 1, a conventional Darlington feedback amplifier 10 is shown. In power applications, multiple parallel input and output transistors are required in order to provide the current and voltage swings demanded by a given transmitter application. The amplifier 10 is shown without input transistor thermal ballasting. The input transistors Q1A and Q1B are typically inherently prone to thermal runaway due to the topology. The amplifier 10 allows individual emitter degeneration through the resistors RE2A and RE2B of the output stage transistors Q2A and Q2B. However, the input transistors Q1A and Q1B feed the common-base terminal A of the output stage transistors Q2A and Q2B and do not perform emitter ballasting. Since both emitters of the input transistors Q1A and Q1B are tied to the common node A, the resistors RE1A and RE1B are prevented from effectively ballasting the input transistors Q1A and Q1B. The amplifier 10 can implement base and emitter ballasting locally about the input transistors Q1A and Q1B. However, such base and emitter ballasting is achieved at the expense of performance (i.e., gain and noise). The output transistors Q2A and Q2B are typically configured with emitter degeneration to provide RF feedback as well as emitter ballasting. The configuration prevents the output stage from thermal runaway.

Referring to FIG. 2, an infrared thermal scan 20 illustrating the relative and absolute temperature of the active devices on an example GaAs HBT semiconductor chip is shown. The scan 20 illustrates that the input transistors (i.e., six parallel connected HBT devices) have thermal runaway, where two of the devices have apparently "runaway" with the bias current due to positive thermal-electrical feedback. The thermal runaway shown in the scan 20 demonstrates the thermal instability of the input transistors of the conventional Darlington amplifier 10, which does not naturally lend itself to thermal ballasting on the input stage transistors Q1A and Q1B. Emitter degeneration or series feedback is typically implemented on the output transistors Q2A and Q2B to provide thermal stability to an output device (not shown). The output transistors Q2A and Q2B typically employ emitter ballasting which leads to stable thermal characteristics. The Darlington amplifier 10 traditionally incorporates emitter degeneration of the output transistors Q2A and Q2B whereas emitter degeneration is not employed on the input transistors Q1A and Q1B.

Referring to FIG. 3, a conventional base ballasting Darlington amplifier 30 is shown. The amplifier 30 employs independent base ballasting of the transistors Q1A and Q1B. While base ballasting can be locally applied to input transistors Q1A and Q1B, the value of the base ballasting resistors, RB1 and RB2 are typically Beta x N, where N is a resistance value required for proper thermal emitter ballasting. The base ballasting values can range from 50–200 ohms which will significantly degrade bandwidth. The ballasting range also introduces thermal noise at the input of the amplifier 30. The implementation of base ballasting comes at the expense of increased thermal noise at the input and higher amplifier noise figure sensitivity with temperature. The addition of thermal noise (which is very sensitive to temperature variations) can preclude the use of base ballasting in wireless transmitter applications such as GSM or CATV. GSM is a European cell phone standard which uses constant envelope modulation. Cellular standards generally have a noise performance specification on the power amplifier component. CATV is community access TV which also requires high power but low transmit noise.

Referring to FIG. 4, a conventional emitter ballasting Darlington amplifier 40 is shown. Emitter ballasting through the resistors REEA and REEB can be applied to the input transistors Q1A and Q1B. The amplifier 40 employs emitter ballasting through the resistors REEA and REEB for the transistors Q1A and Q1B before driving the node A. Such an implementation improves the thermal stability of the input transistors Q1A and Q1B but at the expense of a drop in voltage gain due to the voltage divider resulting from the emitter ballasting resistor REEA and REEB and bias resistors RE1A and RE1B.

U.S. Pat. No. 3,813,588, to Ring, entitled "Efficient Power Darlington Device Configuration" relates to a Darlington device layout structure which efficiently implements semiconductor area to construct a Darlington three terminal device. The device incorporates output transistor emitter ballasting. However, it is not apparent that Ring uses emitter ballasting on the input transistors. Ring alludes to an emitter ballasting resistor "positioned adjacent each emitter sub region in the first row." This is much like the emitter ballasting implementation of the amplifier 40. Ring '588 addresses a Darlington device configuration where the device may be treated as a single active component transistor.

U.S. Pat. No. 5,541,439, to Mojaradi et al., entitled "Layout For A High Voltage Darlington Pair" employs a Darlington device circular layout configuration for obtaining a high voltage Darlington in a compact area. Mojaradi et al. provide a device oriented layout as opposed to a thermally and physically distributed circuit layout of transistors. Mojaradi et al. do not address emitter ballasting for managing the thermal runaway of the input transistor of the Darlington.

U.S. Pat. No. 5,661,431, to Ueno et al., entitled "Output Circuit In Darlington Configuration" addresses an output stage configuration without integrated ballasting. Ueno et al. address the output circuit off leak characteristics by employing an active topology. Ueno et al. is not applicable to thermal runaway problem except that Ueno uses PMOS devices to control the dynamic operation of the Darlington pair.

U.S. Pat. No. 5,883,542, to Eriksson, entitled "Arrangement For Reducing And Stabilizing The Amplification Of A Darlington-Coupled Output Stage" addresses the bias stabilization of a Darlington device through an active device that provides negative feedback. The circuit of Eriksson will stabilize a runaway input device, but not in the case where the input device has multiple fingers.

Generally, the Darlington amplifiers have been used as a wide band gain block. Avantek's layout of their original Darlington amplifier series, the MSAs, show that they do not ballast the input transistor fingers. Ballasting could not have been required because of the lower power capability of those parts as well as the use of silicon which is more thermally conductive than GaAs. The conventional approaches that use localized emitter and base ballasting are obvious techniques that can be employed with the input stage transistor of the Darlington amplifier.

It would be desirable to provide a thermally distributed Darlington topology to address thermal management problems associated with an inferior thermally conductive technology such as GaAs HBTs. Moreover, it would be desirable to provide good thermal ballasting, but without adversely affecting electrical performance. Furthermore, it would be desirable to provide an amplifier with an emitter ballasted for thermally and spatially distributing device hot spots of individual input transistors. It would also be desirable to provide a circuit layout topology to implement such distribution.

SUMMARY OF THE INVENTION

The present invention concerns a Darlington amplifier comprising a first stage and a second stage. The first stage generally comprises one or more first transistors and configured to generate a first and a second signal in response to an input signal. The second stage generally comprises one or more second transistors and may be configured to generate an output signal in response to the first and second signals. The Darlington amplifier may be configured to provide thermal emitter ballasting of the first transistors.

The objects, features and advantages of the present invention include providing a method and/or architecture for implementing high power Darlington feedback amplifiers that may (i) obtain thermal stability without sacrificing electrical performance, (ii) preserve noise figure performance over temperature and/or (iii) preserve gain-bandwidth product.

BRIEF DESCRIPTION OF THE DRAWINGS

These and other objects, features and advantages of the present invention will be apparent from the following detailed description and the appended claims and drawings in which:

FIG. 1 is a schematic of a conventional Darlington without input transistor thermal ballasting;

FIG. 2 is an infrared thermal scan of a conventional Darlington amplifier;

FIG. 3 is a schematic of a conventional Darlington amplifier with input stage base ballasting;

FIG. 4 is a schematic of a conventional Darlington amplifier with input stage emitter ballasting;

FIG. 6a is a schematic of a conventional Darlington amplifier;

DETAILED DESCRIPTION OF THE PREFERRED EMBODIMENTS

The present invention may provide for a method and/or implementation of thermally ballasting emitters of an input stage of a Darlington feedback amplifier without sacrificing the noise or power-bandwidth characteristics of the original Darlington feedback amplifier topology. In order to achieve thermal ballasting of the input transistors, the present invention implements a thermally distributed topology that allows emitter ballasting of the input transistors without adversely affecting electrical performance.

The present invention may implement a Darlington pair topology in a high power application. The power application may require that the first and second stages are large in periphery to handle high current required for high power. Therefore, a number of devices may be implemented for both inputs and outputs. The input and output devices may be implemented as parallel bipolar devices (e.g., bases, emitters and collectors are bussed together).

Figure 5:
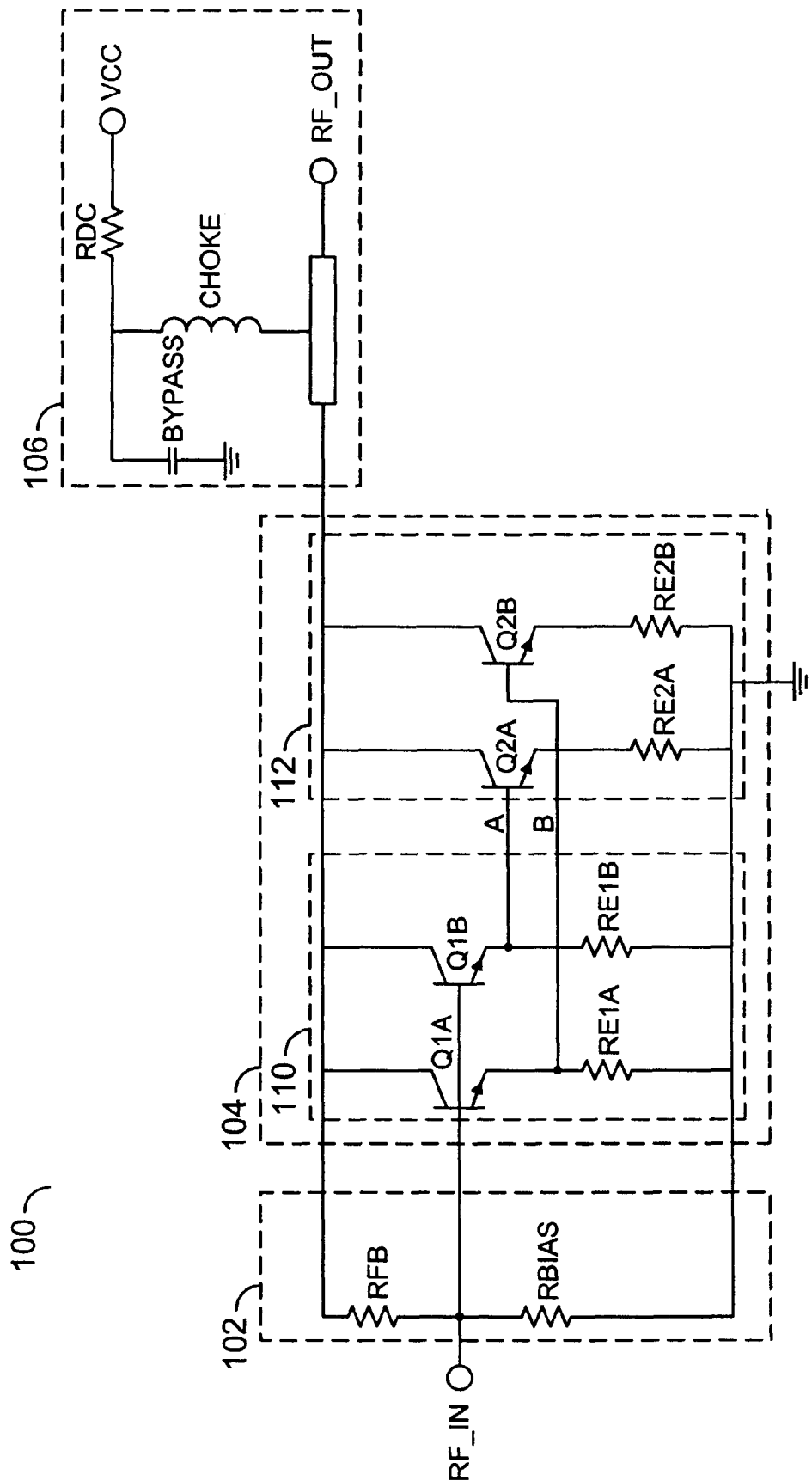
FIG. 5 is a schematic of a thermally distributed Darlington feedback amplifier in accordance with a preferred embodiment of the present invention.

Referring to FIG. 5, a block diagram of circuit 100 is shown in accordance with a preferred embodiment of the present invention. The circuit 100 generally comprises a first block (or circuit) 102, a second block (or circuit) 104, and a third block (or circuit) 106. The first section 102 may be implemented as a resistor (e.g., RFB) and a resistor (e.g., RBIAS). The section 104 may be implemented as a section 110 and a section 112. The section 110 may be implemented as a transistor Q1A, a transistor Q1B, a resistor RE1A and a resistor RE1B. The section 112 may be implemented as a transistor Q2A, a transistor Q2B, a resistor RE2A and a resistor RE2B. The emitter of the transistor Q1B is generally connected to the base of the transistor Q2A, forming a node A. Similarly, the emitter of the transistor Q1A is generally connected to the base of the transistor Q2B, forming the node B. The circuit 106 generally comprises a capacitor (e.g., BYPASS) a resistor (e.g., RDC) and an inductor (e.g., CHOKE). An input signal (e.g., RF_IN) is generally presented to the circuit 102, passes through the circuit 104, then passes through the circuit 106 to present an output signal (e.g., RF_OUT). In one example, the circuit 100 may be implemented as a thermally distributed high power Darlington amplifier topology.

The collectors of the transistors Q1A, Q1B, Q2A and Q2B generally remain connected directly to the output RF_OUT. Base terminals of the input transistors Q1A and Q1B are normally directly coupled to the input signal RF_IN, while the individual emitters are separately connected to the individual base terminals of the second stage transistors Q2A and Q2B. Such a configuration may allow independent emitter ballasting of the input transistors Q1A and Q1B without sacrificing the electrical performance of the amplifier 100. The input and output devices may be distributed, such that each input device has an emitter resistor (e.g., RE1A and RE1B) to provide ballasting that is enabled by the thermally distributed topology.

Additionally, if the power device becomes large or is operating at higher frequencies, the input and output devices may be separated by large distances, such as 1/10 of a quarter wavelength at the frequency of operation (e.g., 10 Ghz). The transmission line feeds (described in more detail in connection with FIGS. 11 and 12) from the emitters of the transistors Q1A and Q1B to the bases of the transistors Q2A and Q2B may be the same length to provide equal phase matching of the signals that are combined at the output collectors of the transistors Q2A and Q2B. Further, the impedance of the transmission lines may be optimized for the particular operating frequencies in question. Moreover, additional transmission lines connecting the collectors of the transistors Q1A and Q1B to Q2A and Q2B respectively, may be matched in length in order to phase balance of the combined signals at the output. Moreover, the width or characteristic impedance may be optimized for maximum power transfer.

The circuit 100 may prevent thermal runaway of the first stage transistors Q1A and Q1B without sacrificing the noise FIG. performance as in the base ballasting Darlington amplifier 30 of FIG. 3 or the gain-bandwidth as in the emitter ballasting Darlington amplifier 40 of FIG. 4. The technique of the present invention may be extended to a plurality of first and second stage transistors. It should be appreciated that the invention is not limited to a one-to-one correspondence between first stage transistors and second stage transistor. In particular, various configurations of first stage transistor emitters can be coupled to different base terminals or groups of base terminals of second stage transistors.

Figure 6B:
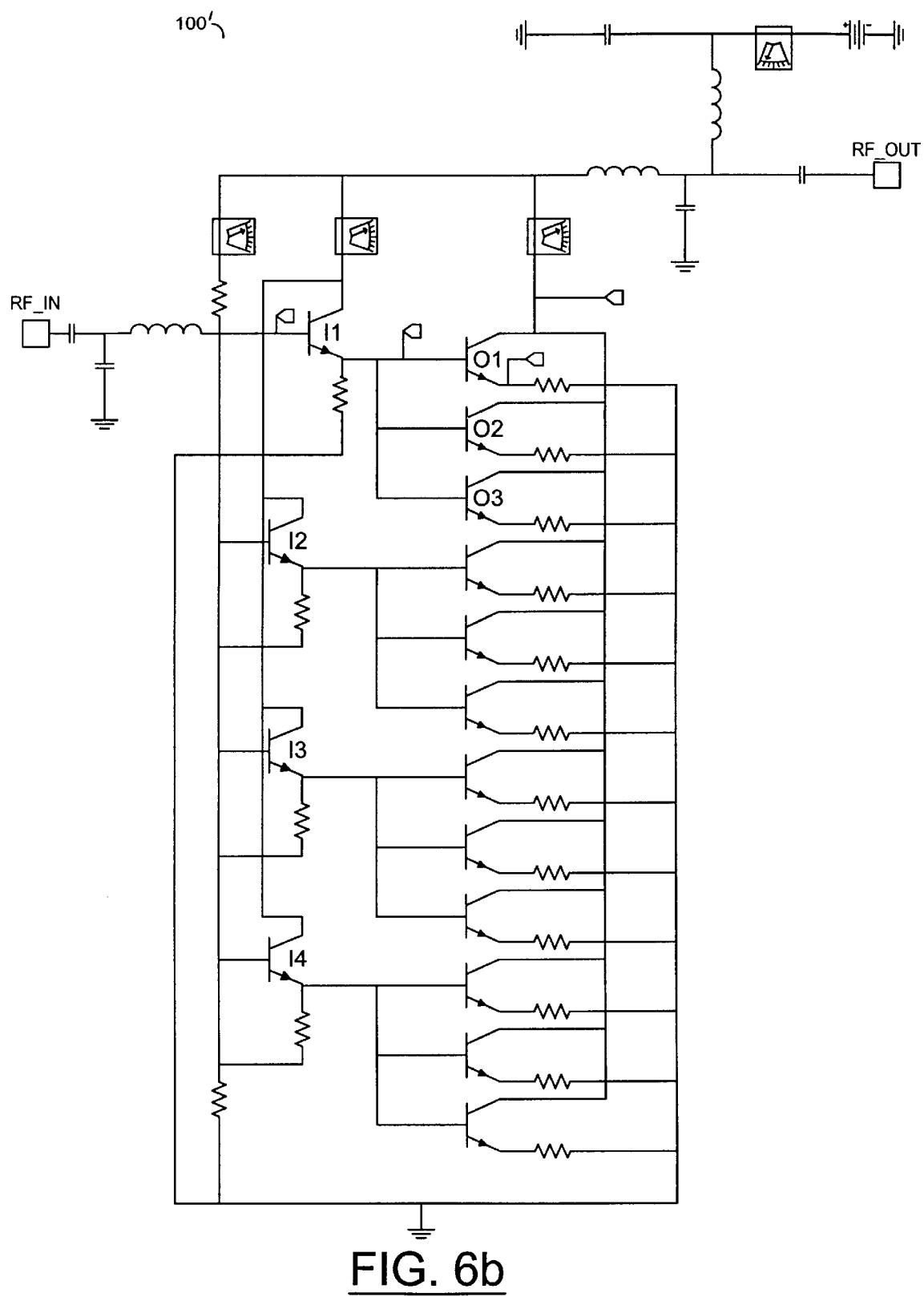
FIG. 6b is a schematic of a distributed Darlington amplifier.
Figure 6B:
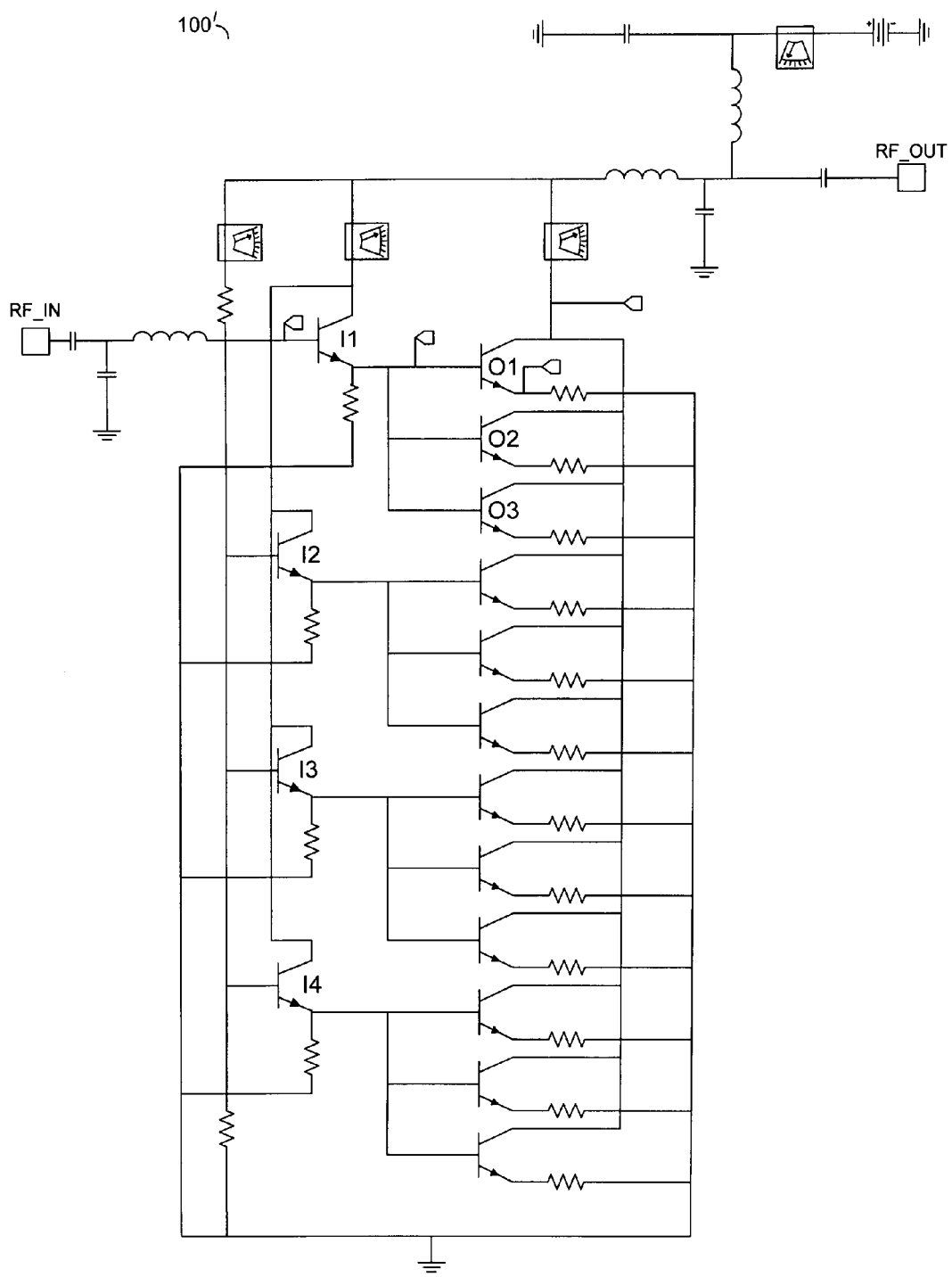

Referring to FIGS. 6(a–b), two Darlington amplifier circuits are shown. FIG. 6a illustrates a simulation schematic 50 of the conventional Darlington amplifiers. In the conventional amplifier 50 of FIG. 6a two large devices D1 and D2 represent the input and output stage transistors. In the thermally distributed Darlington amplifier 100' of FIG. 6b, each of four input transistors I1–I4 are independently emitter ballasted and drive three output transistors each (e.g., transistor I1 drives output transistors O1, O2 and O3). The schematics 50 and 100' of FIGS. 6a and 6b were used to simulate IP3, P1DB, and small signal gain response. The result (not shown) illustrates that there was no appreciable change in RF performance due to the employment of the distributed topology.

Figure 7B:
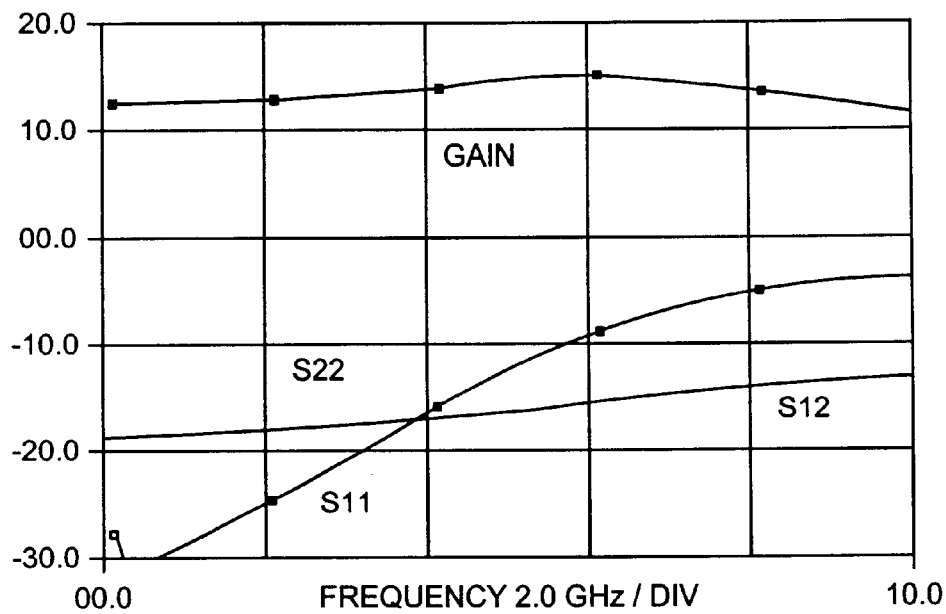
FIG. 7(a–b) are graphs illustrating an operation of a conventional Darlington S-parameters frequency response and an operation of a distributed Darlington S-parameters frequency response.

Referring to FIGS. 7(a–b), two operational graphs are shown. FIGS. 7a and 7b illustrate broadband S-parameter simulation comparisons between the conventional and thermally distributed designs, respectively. FIGS. 7(a–b) may simulate bandwidths greater than 10 GHz. The graphs of FIGS. 7a and 7b indicate there is generally not a degradation in the broadband gain response due to the employment of the distributed Darlington amplifier topology. In practice, as operating frequencies increases, there may be significant differences in performance due to the different transmission line interconnect parasitics of the two implementations. The distributed Darlington topology provides the flexibility to optimize the high frequency electrical performance through the use of distributed transmission line elements. Thus the present invention may offer electrical performance advantages over the conventional approach. Staggered emitter layout (such as the input transistors shown in FIGS. 5, 10 and 11) implement the transistors Q1A and Q1C both in the same orientation and the transistors Q1B and Q1D in an opposite orientation with respect to the X-axis. Such orientation helps distribute the heat generated from the resistors RE1A, B, C and D.

Figure 8B:
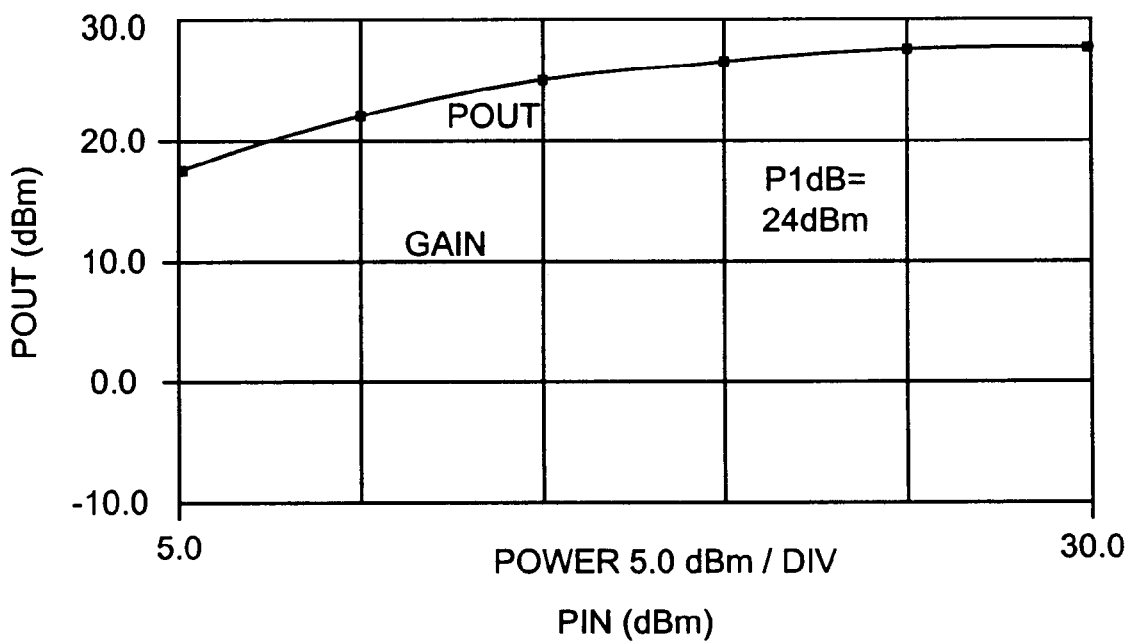
FIG. 8 (a–b) are graphs illustrating an operation of a conventional Darlington output power and gain vs. input power and a distributed Darlington output power and gain vs. input power.

Referring to FIGS. 8(a–b), two operational graphs are shown. FIGS. 8a and 8b illustrate simulation of a comparison between the conventional and thermally distributed designs, respectively. FIGS. 8a and 8b indicate that there is no degradation in fundamental output power and gain compression characteristics due to the employment of the thermally distributed Darlington topology. FIG. 8a may illustrate conventional Darlington output power and gain vs. input power. FIG. 8b may illustrate distributed Darlington output power and gain vs. input power. FIGS. 8(a–b) may both yield approximately P1dB of 24 dBm.

The illustrations of FIGS. 7b and 8b show operational graphs of the invention which take into account thermal distribution of transistors, resistors, thermal ballasting of input transistors of the Darlington. An architecture for combining input transistor and output transistors using distributed transmission lines taking into account proper phase balance for optimum power transfer is generally implemented.

Figure 9B:
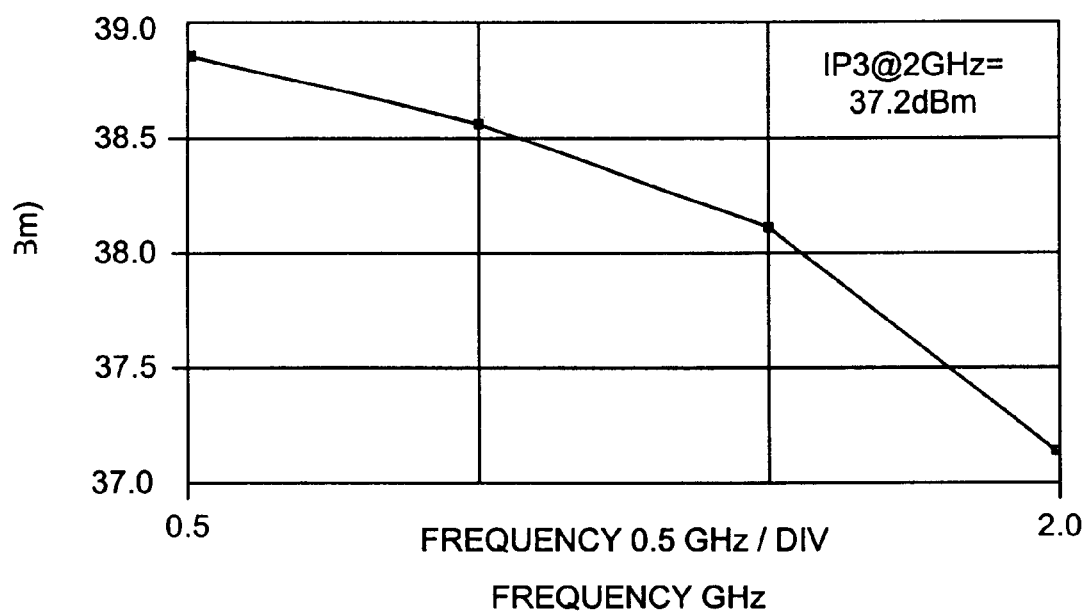
FIG. 9 (a–b) are graphs illustrating an operation of a conventional Darlington IP3 characteristics and an operation of a distributed Darlington IP3 characteristics.

Referring to FIGS. 9(a–b), two operational graphs are shown. FIGS. 9a and 9b illustrate the IP3 simulation of a comparison between the conventional and distributed designs, respectively. FIGS. 9a and 9b indicate that there is no significant degradation in IP3 characteristics due to the employment of the thermally distributed Darlington topology. FIG. 9a illustrates conventional Darlington IP3 characteristics. FIG. 9b illustrates distributed Darlington IP3 characteristics.

Figure 10:
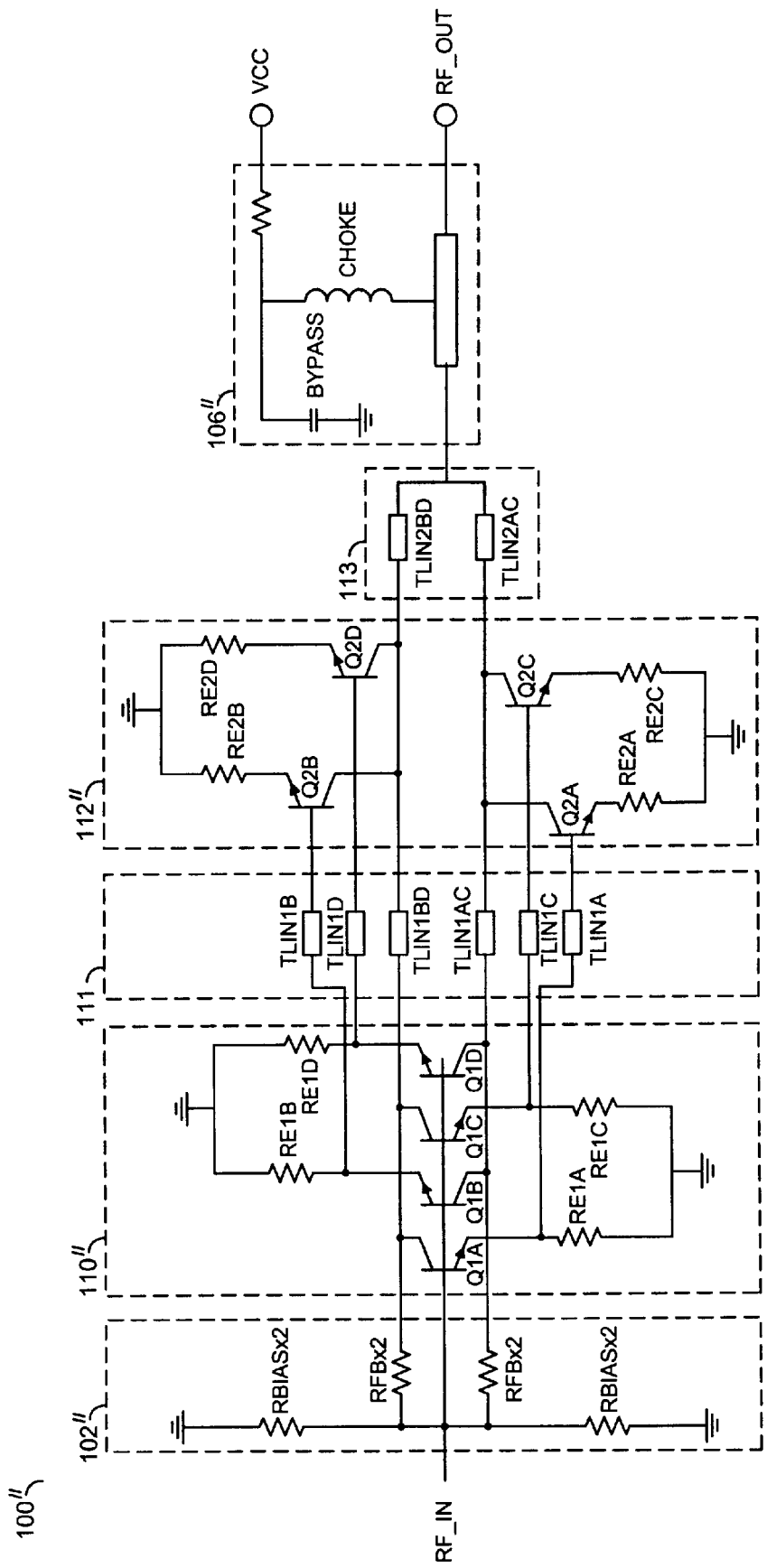
FIG. 10 is a schematic of an embodiment of the present invention.

Referring to FIG. 10, a detailed schematic of an embodiment of a circuit 100" is shown. The circuit 100" shows another employment of the input transistors which are staggered but symmetrically oriented and have common resistors RFB and RB1AS resistors. The circuit 100" has similar features as the circuit 100, with the addition of a transmission line block 111 and a transmission line block 113. The circuit 100" illustrates the input transistors Q1A, B, C and D having emitter ballasting layouts in order to reduce the thermal sharing between resistors and transistors. The circuit 100" may be symmetrical about the x-axis in order to optimize phase power combining at the output. The transmission line pairs TLIN1A/TLIN1C and TLIN1B/TLIN1D are all generally of the same length in order to preserve optimum electrical combining for maximum power operation. The transmission line TLIN1BD and the transmission line TLIN1AC may also be the same length. The output transmission lines TLIN2AC and TLIN2BD may be matched in length. Also, the output transmission lines TLIN1BD and TLIN1AC may be matched in length. The values RB1AS and RFB may be distributed symmetrically in order to distribute thermal power dissipation of the electrical feedback.

Figure 11:
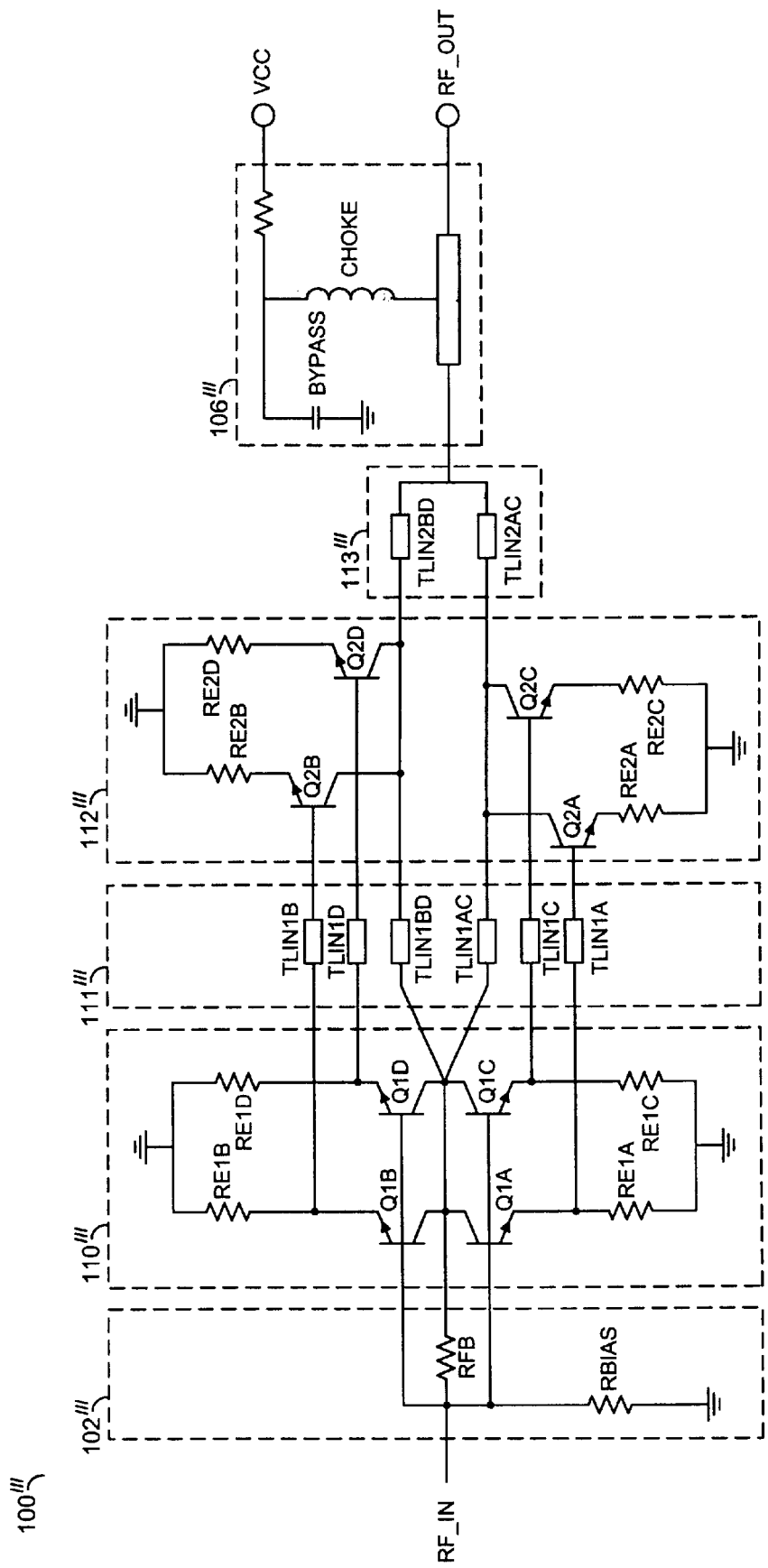
FIG. 11 is a schematic of an alternate embodiment of the present invention.

Referring to FIG. 11, a detailed schematic of a circuit 100''' illustrating an alternate embodiment of the present invention is shown. The circuit 100''' may be similar to the circuit 100". The circuit 100" may implement the input transistors Q1A, B, C and D to have individual emitter ballasting and incorporate a parallel layout structure symmetrical about the x-axis. The configuration of the circuit 100''' may be symmetrical about the x-axis in order to optimize phase power combining at the output. The transmission line pairs TLIN1A, TLIN1B, TLIN1C, and TIN1D may be the same length in order to preserve optimum electrical combining for maximum power operation. The output transmission lines TLIN1BD and TLIN1AC and TLIN2AC and TLIN2BD may be of the same length. The resistors RBIAS and RFB may not distributed, and may provide a global feedback path for the whole thermally distributed Darlington amplifier 100'''.

The circuit 100 may have a broad application which may be applied to a broad range of gain block and power amplifier products. The circuit 100 may be retroactively used in many (e.g., more than 50%) existing standard gain block products and may have far reaching implication for future broadband high power application such as CATV, wireless, and wireline infrastructure products. The circuit 100 may also obtain thermal stability without sacrificing electrical performance, preserve noise figure performance over temperature and preserve gain-bandwidth product.

While the invention has been particularly shown and described with reference to the preferred embodiments thereof, it will be understood by those skilled in the art that various changes in form and details may be made without departing from the spirit and scope of the invention.

What is claimed is:

1. A Darlington amplifier comprising:
   a first stage comprising a plurality of first transistors operating at a microwave frequency and configured to generate a plurality of signals in response to an input signal; and
   a second stage (i) having a physical separation from said first stage sufficient to reduce thermal sharing and (ii) comprising a plurality of second transistors configured to generate an output signal in response to said signals, wherein said amplifier is configured to provide thermal emitter ballasting of said first transistors.

2. The Darlington amplifier according to claim 1, wherein said Darlington amplifier provides a topology configured to operate in a high power application.

3. The Darlington amplifier according to claim 2, wherein said first transistors are large in periphery to handle high current required for said high power application and said second transistors are large in periphery to handle said high current.

4. The Darlington amplifier according to claim 2, wherein said first transistors comprise parallel bipolar devices having a common base and said second transistors comprise parallel bipolar devices having a common collector.

5. The Darlington amplifier according to claim 1, further comprising:
   an input circuit configured to receive said input signal and generate a bias signal presented to said first stage.

6. The Darlington amplifier according to claim 5, wherein said input circuit is further configured to receive a feedback of said output signal and said bias signal is coupled to a base of each of said first transistors.

7. The Darlington amplifier according to claim 1, wherein said Darlington amplifier is further configured to provide said thermal emitter ballasting without sacrificing noise or powerband characteristics.

8. The Darlington amplifier according to claim 1, wherein said physical separation is at least one-tenth a quarter wavelength of said input signal.

9. The Darlington amplifier according to claim 1, wherein a plurality of collectors of said first and said second transistors are coupled to an output terminal configured to present said output signal.

10. The Darlington amplifier according to claim 1, wherein a plurality of bases of said first transistors are directly coupled to an input terminal configured to receive said input signal.

11. The Darlington amplifier according to claim 10, wherein an emitter of each of said first transistors is coupled to a base among said second transistors.

12. The Darlington amplifier according to claim 1, wherein:
   said first stage further comprises a plurality of first resistors each coupled in series with at least one of said first transistors; and
   said second stage further comprises a plurality of second resistors each coupled in series with at least one of said second transistors.

13. The Darlington amplifier according to claim 1, further comprising:
   an output circuit configured to control said output signal.

14. A Darlington amplifier comprising:
   means for generating a plurality of signals in response to an input signal with a plurality first transistors operating at a microwave frequency;
   means for generating an output signal in response to said signals with a plurality of second transistors having a physical separation from said first transistors sufficient to reduce thermal sharing; and
   means for providing thermal emitter ballasting of said first transistors.

15. A method for providing a thermally distributed Darlington amplifier pair topology, comprising the steps of:
   (A) generating a plurality of signals in response to an input signal with a plurality of first transistors operating at a microwave frequency;
   (B) generating an output signal in response to said signals with a plurality of second transistors;
   (C) providing thermal emitter ballasting of said first transistors; and
   (D) reducing thermal sharing between said first transistors and said second transistors through a physical separation.

16. The method according to claim 15, wherein said Darlington amplifier pair topology is configured to operate in a high power application.

17. The method according to claim 16, wherein:
   step (A) further comprises handling high current required for said high power application with said first transistors; and
   step (B) further comprises handling said high current.

18. The method according to claim 17, wherein said first transistors comprise parallel bipolar devices having a common base and said second transistors comprise parallel bipolar devices having a common collector.

19. The method according to claim 15, wherein step (C) further comprises:
   providing said thermal emitter ballasting without sacrificing noise or powerband characteristics.

20. The method according to claim 15, wherein:
   step (A) further comprises coupling a plurality of first resistors in series with said first transistors; and
   step (B) further comprises coupling a plurality of second resistors in series with said second transistors.

21. A circuit comprising:
   a plurality of first transistors having a common base and configured to generate a plurality of signals in response to an input signal;
   a plurality of second transistors having a physical separation from said first transistor to reduce thermal sharing and at least one common collector and configured to generate an output signal in response to said signals; and
   a plurality of resistors each in series between a node and an emitter among said first and said second transistors.

22. The circuit according to claim 21, wherein said node is directly connected to a ground.

23. The circuit according to claim 21, further comprising:
   a plurality of transmission lines disposed between said first transistors and said second transistors.

24. The circuit according to claim 23, wherein at least one of said transmission lines is connected between at least one emitter of said first transistors and at least one base of said second transistors.

25. The circuit according to claim 21, further comprising:
a plurality of transmission lines disposed between said second transistors and an output node carrying said output signal.

26. The circuit according to claim 21, wherein said second transistors are greater in number than said first transistors.

27. The circuit according to claim 21, wherein said resistors are symmetrically oriented about an axis.

28. The circuit according to claim 27, wherein at least two of said resistors are staggered along said axis.

29. The circuit according to claim 27, wherein said first resistors are on said axis.

30. The circuit according to claim 21, further comprising:
a plurality of feedback paths to said common base of said first transistors.

31. The Darlington amplifier according to claim 1, wherein said first transistors are physically separated from each other sufficient to reduce thermal sharing.

* * * * *

UNITED STATES PATENT AND TRADEMARK OFFICE
CERTIFICATE OF CORRECTION

PATENT NO. : 6,611,172 B1
DATED : August 26, 2003
INVENTOR(S) : Kevin W. Kobayashi and Stephen T. Farris It is certified that error appears in the above-identified patent and that said Letters Patent is hereby corrected as shown below:

Drawings,
Delete Fig. 6b and substitute therefor Fig 6b as shown on the attached page Signed and Sealed this Twenty-fourth Day of August, 2004

JON W. DUDAS
*Director of the United States Patent and Trademark Office*